(12) United States Patent
Hiraoka et al.

(10) Patent No.: US 10,077,505 B2
(45) Date of Patent: Sep. 18, 2018

(54) METAL-FILM FORMING APPARATUS AND METAL-FILM FORMING METHOD

(71) Applicant: TOYOTA JIDOSHA KABUSHIKI KAISHA, Toyota-shi, Aichi-ken (JP)

(72) Inventors: Motoki Hiraoka, Toyota (JP); Hiroshi Yanagimoto, Miyoshi (JP); Yuki Sato, Nisshin (JP)

(73) Assignee: TOYOTA JIDOSHA KABUSHIKI KAISHA, Toyota-shi, Aichi-ken (JP)

(*) Notice: Subject to any disclaimer, the term of this patent is extended or adjusted under 35 U.S.C. 154(b) by 164 days.

(21) Appl. No.: 14/979,914

(22) Filed: Dec. 28, 2015

(65) Prior Publication Data
US 2016/0186354 A1 Jun. 30, 2016

(30) Foreign Application Priority Data

Dec. 26, 2014 (JP) ................. 2014-265915

(51) Int. Cl.
| | |
|---|---|
| C25D 17/00 | (2006.01) |
| C25D 3/12 | (2006.01) |
| C25D 3/46 | (2006.01) |
| C25D 3/48 | (2006.01) |
| C25D 5/02 | (2006.01) |
| H05K 3/24 | (2006.01) |

(Continued)

(52) U.S. Cl.
CPC ............ *C25D 17/002* (2013.01); *C25D 3/00* (2013.01); *C25D 3/12* (2013.01); *C25D 3/46* (2013.01); *C25D 3/48* (2013.01); *C25D 5/02* (2013.01); *C25D 17/005* (2013.01); *C25D 17/14* (2013.01); *H05K 3/242* (2013.01); *C25D 3/38* (2013.01); *H05K 2203/0723* (2013.01)

(58) Field of Classification Search
CPC .... C25D 17/002; C25D 17/14; C25D 17/005; C25D 3/48; C25D 3/00; C25D 3/12; C25D 3/38; C25D 5/02; H05K 2203/0723; H05K 3/242
See application file for complete search history.

(56) References Cited

U.S. PATENT DOCUMENTS

2003/0168345 A1* 9/2003 Tsai ................. C25D 21/12
 205/157
2015/0014178 A1* 1/2015 Hiraoka ............ C25D 5/08
 205/261

FOREIGN PATENT DOCUMENTS

| CN | 104011269 A | 8/2014 |
|---|---|---|
| JP | 04110491 A | 4/1992 |

(Continued)

*Primary Examiner* — Louis J Rufo
(74) *Attorney, Agent, or Firm* — Sughrue Mion, PLLC

(57) ABSTRACT

A metal-film forming apparatus includes: an anode; a resin substrate having a surface on which a conductor pattern layer that serves as a cathode is formed; a solid electrolyte membrane that contains metal ions and is between the anode and the resin substrate, the solid electrolyte membrane contacting a surface of the conductor pattern layer when a metal film is formed; a power supply; and a conductive member that is arranged contacting the conductor pattern layer when the metal film is formed, such that a negative electrode of the power supply is electrically connected to the conductor pattern layer, the conductive member being detachable from the conductor pattern layer, wherein the metal ions are reduced to deposit metal that forms the metal film on the surface of the conductor pattern layer when the voltage is applied.

6 Claims, 9 Drawing Sheets

(51) Int. Cl.
*C25D 3/00* (2006.01)
*C25D 17/14* (2006.01)
*C25D 3/38* (2006.01)

(56) References Cited

FOREIGN PATENT DOCUMENTS

| | | | |
|---|---|---|---|
| JP | WO 2013125643 A1 * | 8/2013 | ............... C25D 5/08 |
| KR | 10-2014-0122270 A | 10/2014 | |
| WO | 2013/125643 A1 | 8/2013 | |

* cited by examiner

F I G . 7
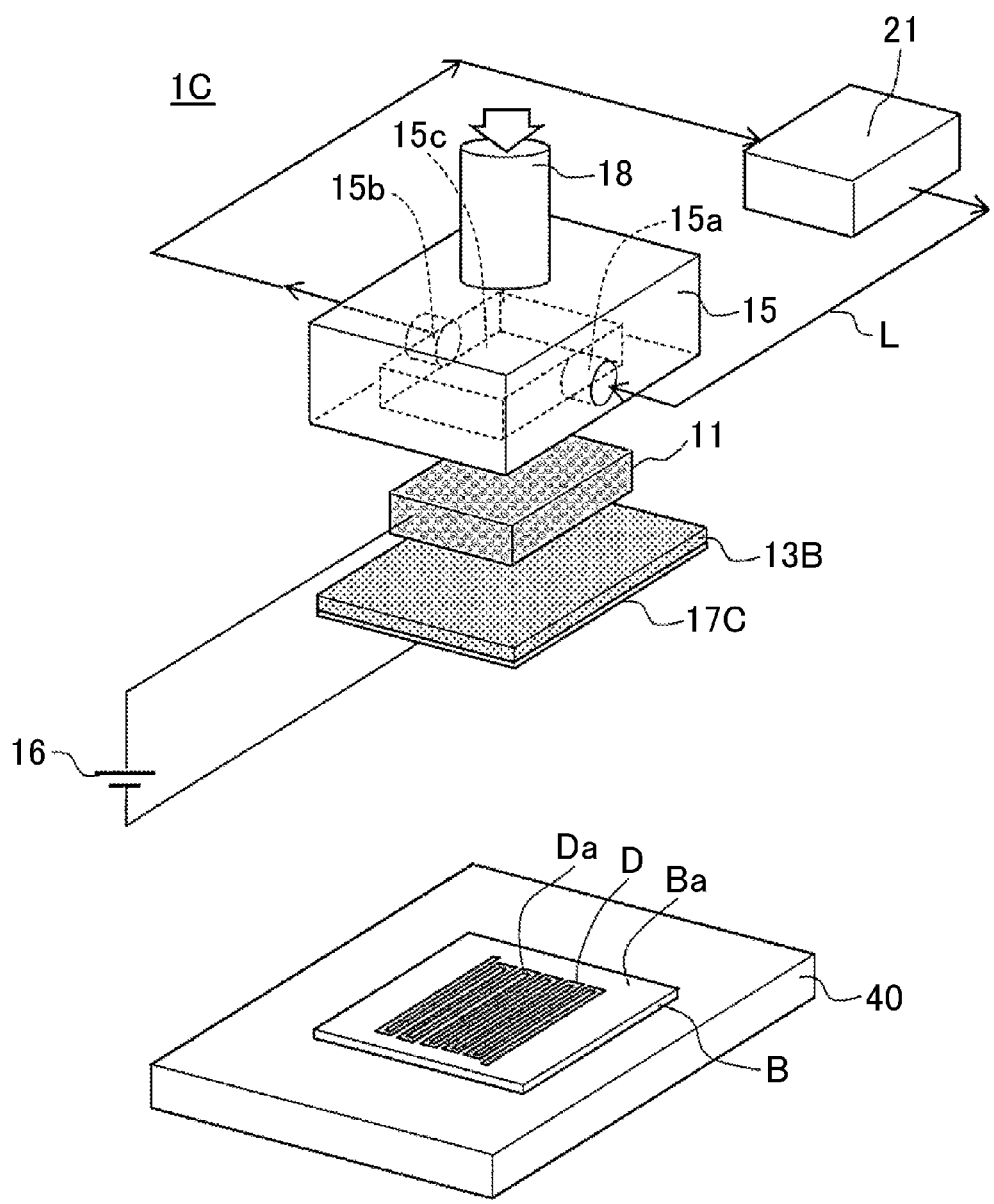

TO NEGATIVE ELECTRODE OF POWER SUPPLY

METAL-FILM FORMING APPARATUS AND METAL-FILM FORMING METHOD

INCORPORATION BY REFERENCE

The disclosure of Japanese Patent Application No. 2014-265915 filed on Dec. 26, 2014 including the specification, drawings and abstract is incorporated herein by reference in its entirety.

BACKGROUND OF THE INVENTION

1. Field of the Invention

The invention relates to a metal-film forming apparatus and a metal-film forming method. More particularly, the invention relates to a metal-film forming apparatus and a metal-film forming method that are capable suitably forming a metal film on a surface of a conductor pattern layer formed on a resin substrate.

2. Description of Related Art

Conventionally, when manufacturing an electronic circuit substrate or the like, a metal film is formed on a surface of a substrate in order to form a metal circuit pattern. As film forming technology of such a metal film, technology that forms a metal film by a plating process such as a non-electrolytic plating process, or film forming technology that forms a metal film by a PVD method such as sputtering, on a surface of a semiconductor substrate of Si or the like, for example, have been proposed.

However, when a plating process such as a non-electrolytic plating process is performed, rinsing after the plating process is necessary, and the resultant waste water must then be disposed of. Also, when a film is formed on a substrate surface by a PVD method such as sputtering, internal stress is generated in the metal-film coating, so there is a limit as to just how thick the film can be. In particular, with sputtering, the film is only able to be formed in a high vacuum.

In view of this, International Publication No. WO 2013/125643, for example, proposes a metal-film forming apparatus that includes a positive electrode, a solid electrolyte membrane arranged between an anode and a metal substrate that serves as a cathode, and a power supply portion that applies a voltage between the anode and the cathode (i.e., the metal substrate).

With this film forming apparatus, metal ions are deposited on a surface of the metal substrate, such that a metal film is able to be formed on the metal substrate, by making the solid electrolyte membrane containing metal ions contact the surface of the metal substrate, and applying a voltage between the anode and the cathode (i.e., the metal substrate) with the power supply portion.

When the film forming apparatus described in International Publication No. WO 2013/125643 is used, it is easy to electrically connect the substrate or the surface layer thereof to a negative electrode of the power supply such that the substrate or the surface layer thereof becomes the cathode, because until now the substrate or the entire surface layer thereof has been made of metal.

However, when forming a metal film on a surface Da of a conductor pattern layer D formed on a surface Ba of a resin substrate B, as shown in FIG. 10A, the conductor pattern layer D must be electrically connected to the negative electrode of the power supply so that the conductor pattern layer D becomes the cathode.

Therefore, for example, an extension portion DL in which a portion of the conductor pattern layer D extends to a peripheral edge portion Bc of the resin substrate B is provided, as shown in FIG. 10B. This extension portion DL is made to contact a metal base 40 that is electrically connected to the negative electrode of the power supply, and a metal film is formed on the surface of the conductor pattern layer D. After the film is formed, the extension portion DL is an unnecessary conductor pattern layer, so this extension portion DL must be removed from the resin substrate B.

SUMMARY OF THE INVENTION

The invention thus provides a metal-film forming apparatus and a metal-film forming method that are capable of easily forming a metal film on a surface of a conductor pattern layer formed on a surface of a resin substrate, without forming an unnecessary conductor pattern layer.

A first aspect of the invention is a metal-film forming apparatus comprising: an anode; a resin substrate having a surface on which a conductor pattern layer that serves as a cathode is formed; a solid electrolyte membrane that contains metal ions and is arranged between the anode and the resin substrate, the solid electrolyte membrane being arranged contacting a surface of the conductor pattern layer when a metal film is formed; a power supply that applies a voltage between the anode and the conductor pattern layer; and a conductive member that is arranged contacting at least a part of the conductor pattern layer when the metal film is formed, such that a negative electrode of the power supply is electrically connected to the conductor pattern layer, the conductive member being detachable from the conductor pattern layer, wherein the metal ions are reduced to deposit metal that forms the metal film on the surface of the conductor pattern layer when the voltage is applied between the anode and the conductor pattern layer.

According to this aspect, the metal film is able to be formed on the surface of the conductor pattern layer by applying a voltage between an anode and the conductor pattern layer that serves as a cathode, while making the conductive member contact a portion of the conductor pattern layer, such that a negative electrode of a power supply that applies voltage is electrically connected to the conductor pattern layer. Also, using the detachable conductive member enables metal to be deposited, by reducing metal ions contained in the solid electrolyte membrane, on a surface of the conductor pattern layer that is the surface on which the film is to be formed, and a metal film to be easily formed on this surface, without also forming an unnecessary conductor pattern layer.

The phrase "conductive member being detachable" in this aspect refers to a conductive member that is in an attached state when contacting a portion of the conductor pattern layer, and that is able to be removed from the portion of the conductor pattern layer that it contacts.

In the first aspect, the conductive member may be a metal plate that covers the resin substrate, and the conductive member may have a through-hole corresponding to a pattern shape of the conductor pattern layer. In addition, the conductive member may be arranged such that the through-hole is positioned over the conductor pattern layer when the metal film is formed.

The phrase "through-hole corresponding to a pattern shape of the conductor pattern layer" in this aspect refers to a through-hole having at least the same shape as the conductor pattern layer on the resin substrate, provided in a metal plate, when the metal plate is laid over the resin substrate. The conductive member is provided in order to make the solid electrolyte member contact the conductor pattern layer via the through-hole.

In the aspect described above, the conductive member is arranged between the anode and the conductor pattern layer, such that the through-hole in the conductive member is positioned over the conductor pattern layer when the conductive member is contacting a portion of the conductor pattern layer. Hence, metal ions are supplied from the solid electrolyte membrane to the surface of the conductor pattern layer via the through-hole in the conductive member while the surface of the resin substrate is masked by the conductive member, so metal is able to be deposited on the surface of the conductor pattern layer. As a result, metal is only deposited in the layer thickness direction of the conductor pattern layer, so a metal film with a distinctive edge portion is able to be formed in a desired region (without protruding out from the conductor pattern layer, for example).

In the first aspect, the conductive member may be attached to the solid electrolyte membrane. According to this aspect, the conductive member, together with the solid electrolyte membrane, is able to contact the conductor pattern layer when forming a metal film, so the metal film is able to be formed more easily on the surface of the conductor pattern layer.

In the first aspect, the metal film may be made of copper, nickel, silver, or gold, and the conductive member may be made of aluminum, titanium, molybdenum, tungsten, or an alloy of at least two of aluminum, titanium, molybdenum, and tungsten. According to this aspect, selecting one of these metals as the metal that forms the conductive member makes it possible to prevent metal from being deposited on the conductive member.

A second aspect of the invention is a suitable method for forming a metal film. The method for forming a metal film according to the second aspect includes executing a forming of a metal film on a surface of a conductor pattern layer provided on a surface of a resin substrate by depositing metal on the surface of the conductor pattern layer, by applying a voltage between an anode and the conductor pattern layer that serves as a cathode and reducing metal ions in a solid electrolyte membrane, in a state where the solid electrolyte membrane is arranged between the anode and the resin substrate to contact the surface of the conductor pattern layer, wherein the forming of the metal film includes applying the voltage between the anode and the conductor pattern layer in a state where a conductive member that is detachable from the conductor pattern layer contacts at least a part of the conductor pattern layer, such that a negative electrode of a power supply that applies the voltage is electrically connected to the conductor pattern layer.

According to this structure, a voltage is applied between the anode and the conductor pattern layer that serves as the cathode, while making the conductive member contact a portion of the conductor pattern layer, such that the negative electrode of the power supply that applies voltage is electrically connected to the conductor pattern layer. Therefore, a metal film is able to be easily formed on the surface of the conductor pattern layer without also forming an unnecessary conductor pattern layer.

In the second aspect, the conductive member may be a metal plate that covers the resin substrate, and the conductive member may have a through-hole corresponding to a pattern shape of the conductor pattern layer. In addition, the metal film may be formed while the conductive member is arranged such that the through-hole is positioned over the conductor pattern layer.

According to the aspect described above, metal ions are supplied from the solid electrolyte membrane to the surface of the conductor pattern layer via the through-hole in the conductive member while the surface of the resin substrate is masked by the conductive member, so metal is able to be deposited on the surface of the conductor pattern layer. As a result, metal is only deposited in the layer thickness direction of the conductor pattern layer, so a metal film with a distinctive edge portion is able to be formed.

In the second aspect, the forming of the metal film may be performed in a state where the conductive member is attached to the solid electrolyte membrane. According to this aspect, the conductive member, together with the solid electrolyte membrane, is able to contact the conductor pattern layer when forming a metal film, so the metal film is able to be formed more easily on the surface of the conductor pattern layer.

In the second aspect, the metal film may be made of copper, nickel, silver, or gold, and the conductive member may be made of aluminum, titanium, molybdenum, tungsten, or an alloy of at least two of aluminum, titanium, molybdenum, and tungsten. According to this aspect, selecting one of these metals as the metal that forms the conductive member makes it possible to prevent metal from being deposited on the conductive member.

The aspects of the invention thus makes it possible to easily form a metal film on a surface of a conductor pattern layer formed on a surface of a resin substrate, without forming an unnecessary conductor pattern layer.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 7 is an exploded conceptual diagram schematically showing a metal-film forming apparatus according to a third example embodiment of the invention;

DETAILED DESCRIPTION OF EMBODIMENTS

A film forming apparatus capable of suitably executing a metal-film forming method according to three example embodiments of the invention will be described below.

Figure 1:
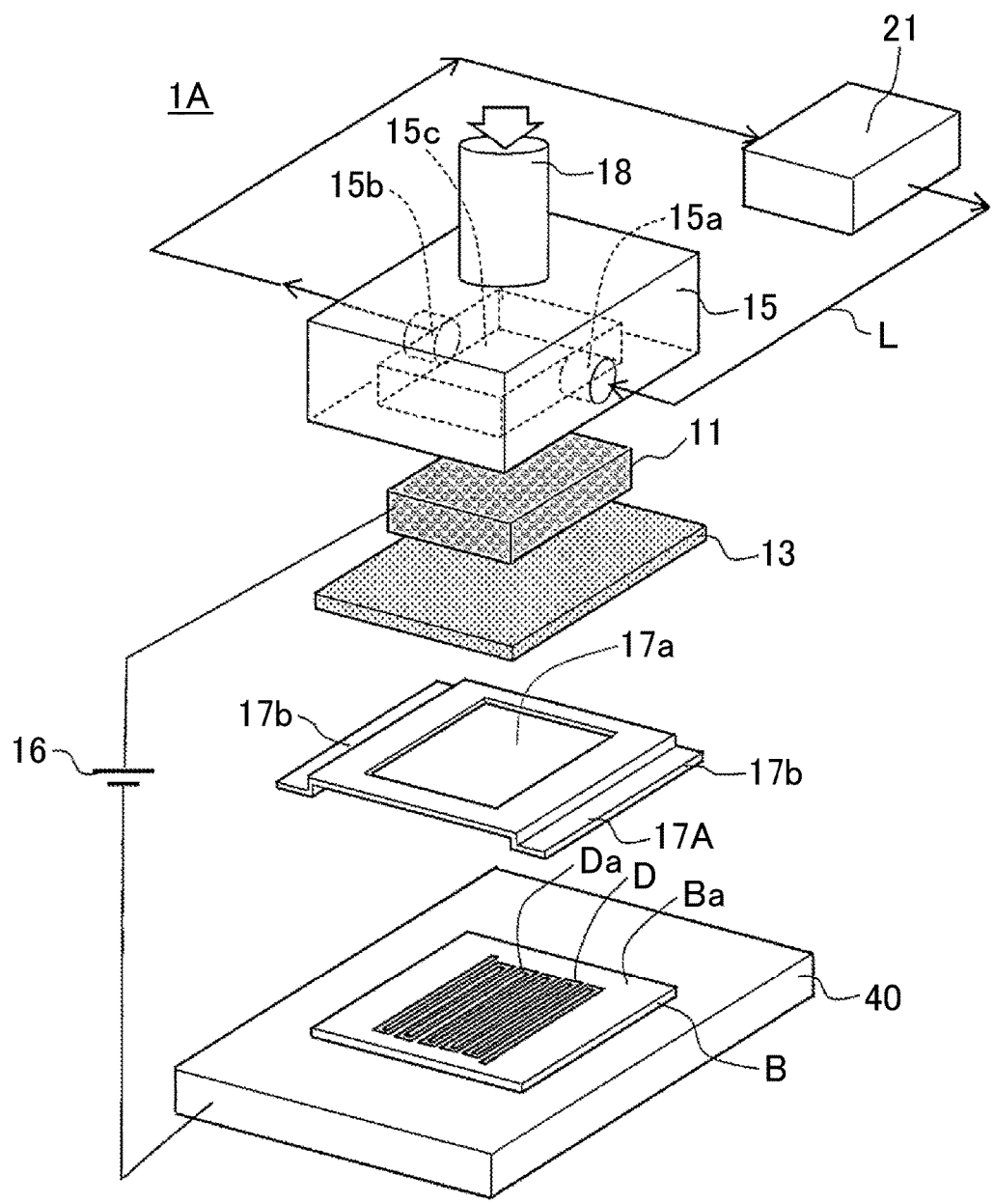
FIG. 1 is an exploded conceptual diagram showing a frame format of a metal-film forming apparatus according to a first example embodiment of the invention.
Figure 2:
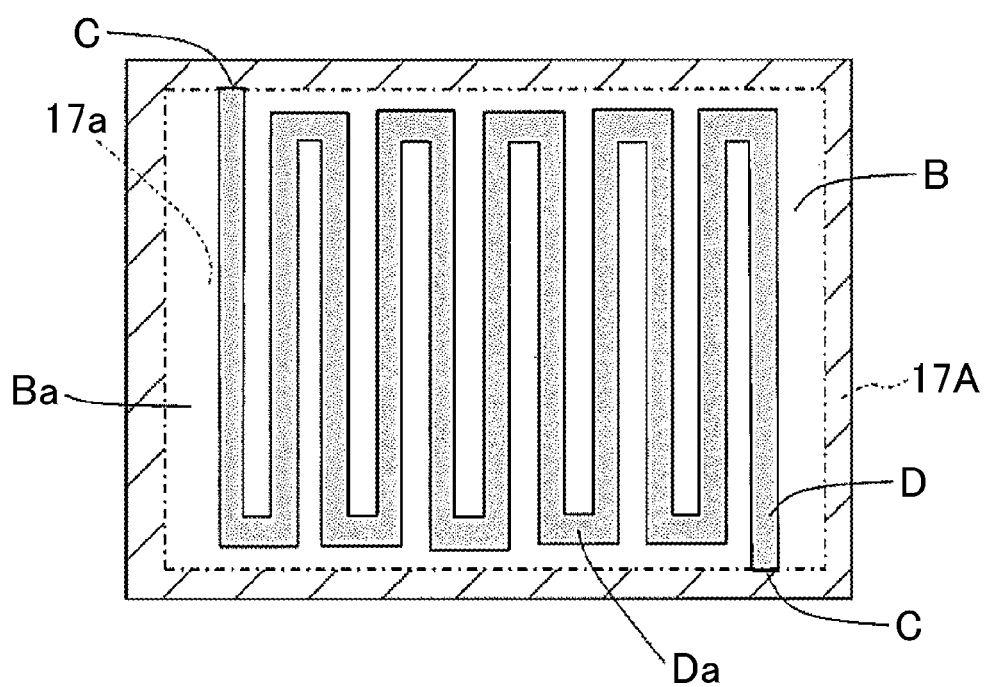
FIG. 2 is a plan view illustrating the positional relationship between a conductor pattern layer formed on a resin substrate, and a conductive member.

Hereinafter, a first example embodiment will be described. FIG. 1 is an exploded conceptual diagram showing a frame format of a metal-film forming apparatus 1A according to the first example embodiment of the invention. FIG. 2 is a plan view illustrating the positional relationship between a conductor pattern layer D formed on a resin substrate B, and a conductive member 17A.

As shown in FIG. 1, a film forming apparatus 1A is an apparatus that deposits metal by reducing metal ions, and forms a metal film formed by the deposited metal on a surface Da of the conductor pattern layer D of the resin substrate B.

Examples of resins that may be used for the resin that forms the resin substrate B include a thermoplastic resin such as epoxy resin, ABS resin, AS resin, AAS resin, PS resin, EVA resin, PMMA resin, PBT resin, PET resin, PPS resin, PA resin, POM resin, PC resin, PP resin, PE resin, polymer alloy resin including an elastomer and PP, a modified PPO resin, PTFE resin, ETFE resin, or a thermosetting resin such as phenol, or a resin in which cyanate resin has been added to epoxy resin.

The conductor pattern layer D having a predetermined pattern is formed on a surface Ba of the resin substrate B. The conductor pattern layer D is a conductor layer in which metal particles have been adhered to the surface Ba of the resin substrate B by spray application or printing or the like, which are typically known. Copper, nickel, silver, or gold or the like may be used for the metal that forms the conductor pattern layer D.

Figure 3A:
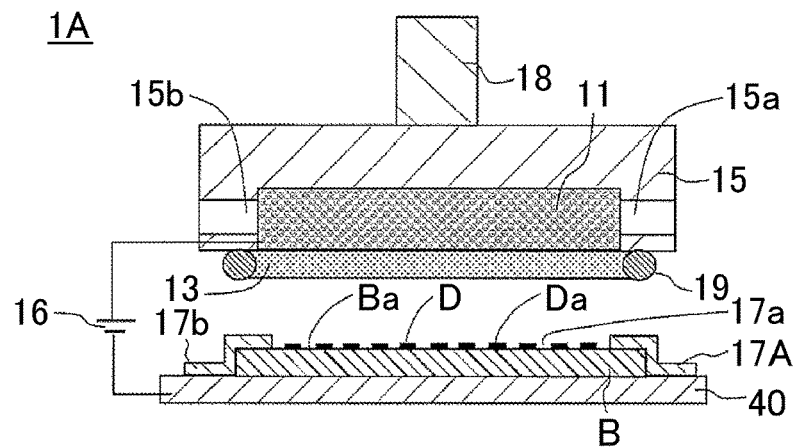
FIG. 3A is a sectional view showing a frame format of a film forming apparatus shown in FIG. 1 before a film is formed.

The film forming apparatus 1A includes at least an anode 11 that is made of metal, the conductor pattern layer D (of the resin substrate B) that serves as a cathode, a solid electrolyte membrane 13 arranged on the surface of the anode 11, between the anode 11 and the conductor pattern layer D, and a power supply 16 that applies a voltage between the anode 11 and the conductor pattern layer D that serves as the cathode. Although not shown in FIG. 1, a seal member 19 such as an O-ring is arranged on a peripheral edge of the solid electrolyte membrane 13, as shown in FIG. 3A that will be described later.

In this example embodiment, the film forming apparatus 1A also includes a housing 15. The anode 11 is housed inside of this housing 15 that supplies a solution containing ions of a metal such as copper, nickel, silver, or gold or the like (hereinafter, this solution will be referred to as a "metal solution") L to the anode 11. More specifically, a housing recessed portion 15c that houses the anode 11 is formed on the lower side in the housing 15, and the anode 11 is housed in this housing recessed portion 15c.

In this example embodiment, a supply passage 15a that supplies the metal solution L to the housing 15 is formed communicated with the housing recessed portion 15c, on one side of the housing recessed portion 15c, in the housing 15. Also, a discharge passage 15b that discharges the metal solution L from the housing 15 is formed communicated with the housing recessed portion 15c, on the other side of the housing recessed portion 15c.

The anode 11 is made of porous material through which the metal solution L passes, and that supplies metal ions to the solid electrolyte membrane. As a result, the metal solution L supplied from the supply passage 15a flows through the anode 11. Some of the metal solution L that flows through the anode 11 contacts the solid electrolyte membrane 13 from the anode 11, and film-forming metal ions are supplied to the solid electrolyte membrane 13. Furthermore, the metal solution L that has passed through the anode 11 is discharged from the discharge passage 15b.

The porous material that forms the anode 11 is not particularly limited as long as (1) it has corrosion resistance with respect to the metal solution L, (2) it has electric conductivity that enables it to be used as an anode, (3) the metal solution L is able to pass through it, and (4) it can be pressed on by a pressing portion 18 that will be described later. For example, the anode 11 is preferably formed by a foamed metal body of material with a low oxygen overpotential such as platinum or iridium oxide, or a foamed metal body having high corrosion resistance such as titanium that has been covered with platinum or iridium oxide. When a foamed metal body is used, the porosity is preferably 50 to 95 volume percent, the pore diameter is preferably approximately 50 to 600 μm, and the thickness is preferably approximately 0.1 to 50 mm.

The supply passage 15a and the discharge passage 15b are connected to a metal solution supply portion 21 via a conduit. The metal solution supply portion 21 supplies the metal solution L that has been regulated to a predetermined metal ion concentration to the supply passage 15a of the housing 15, and recovers the metal solution L that has been used to form the film and discharged from the discharge passage 15b. In this way, the metal solution L is able to be circulated inside the film forming apparatus 1A.

The solid electrolyte membrane 13 is not particularly limited as long as it is able to be impregnated with (i.e., include) metal ions by being brought into contact with the metal solution L described above, and metal derived from the metal ions is able to be deposed on the surface Da of the conductor pattern layer D of the resin substrate B when voltage is applied. For the material of the solid electrolyte membrane, a fluorine resin such as Nafion (trade name) by DuPont or the like, a hydrocarbon resin, a polyamic resin, or a resin having an ion-exchange function such as SELEMION™ (CMV, CMD, CMF series) or the like by Asahi Glass Co., Ltd. may be used, for example.

Alternatively, the metal solution L is a liquid that contains the metal of the metal film to be formed as described above, in an ion state. The metal in the metal solution L is, for example, copper, nickel, silver, or gold, and the metal solution L is formed by at least one of these metals being dissolved (ionized) in an acid such as nitric acid, phosphoric acid, succinic acid, nickel phosphate, or pyrophosphoric acid. For example, when the metal is nickel, the metal solution L is a solution of nickel nitrate, nickel phosphate, nickel succinic acid, nickel sulfate, or nickel pyrophosphate, or the like.

The film forming apparatus 1A includes the pressing portion 18 in an upper portion of the housing 15. The pressing portion 18 is a hydraulic or pneumatic cylinder, and is a device that presses the solid electrolyte membrane 13 against the surface Da of the conductor pattern layer D via the anode 11. A metal film is able to be formed on the surface Da of the conductor pattern layer D while the solid electrolyte membrane 13 is being evenly pressed against the conductor pattern layer D by the pressing portion 18.

The film forming apparatus 1A according to this example embodiment includes a metal base 40 on which the resin substrate B is placed, and this metal base 40 is electrically connected to a negative electrode of the power supply 16. A positive electrode of the power supply 16 is electrically connected to the anode 11 that is built into the housing 15. Moreover, the film forming apparatus 1A includes a conductive member 17A that contacts a portion (more specifically, an end portion) of the conductor pattern layer D when forming a metal film, so as to electrically connect the negative electrode of the power supply 16 to the conductor pattern layer D. The conductive member 17A is in an attached state when it is contacting a portion of the conductor pattern layer D when forming a film, and is able to be removed from the portion of the conductor pattern layer that it is contacting. In this example embodiment, the conductive member 17A is a member that is arranged on the resin substrate B so as to freely contact a portion of the conductor pattern layer D, and is detachable from the portion of the conductor pattern layer D.

Here, the conductive member 17A is a metal sheet that covers the resin substrate B. A rectangular through-hole 17a corresponding to the size of the conductor pattern layer D is formed in the conductive member 17A, and a pair of flange portions 17b are formed one on each side of this through-hole 17a. When the conductive member 17A is arranged on the surface Ba of the resin substrate B, a peripheral edge portion (the region indicated by diagonal lines in the drawing) of the surface Ba of the resin substrate B is covered by the conductive member 17A, and the through-hole 17a is formed such that the conductor pattern layer D is exposed through the through-hole 17a. Moreover, the through-hole 17a is formed such that a portion of an opening edge that forms the through-hole 17a of the conductive member 17A contacts an end portion C of the conductor pattern layer D. As a result, the conductive member 17A is able to be electrically connected to the conductor pattern layer D.

The conductive member 17A is made of metal on which a non-conducting film is easily formed, or a chemically stable metal. More specifically, if the metal that forms the metal film is copper, nickel, silver, or gold, the metal that forms the conductive member 17A is aluminum, titanium, molybdenum, tungsten, or an alloy of these. Selecting such a metal makes it possible to form a metal film on the surface Da of the conductor pattern layer D when forming a film, and prevent a metal film from being formed (i.e., film-forming metal from being deposited) on the conductive member 17A, or prevent the conductive member 17A from dissolving.

The conductive member 17A is a plate-like member having a thickness of no more than 0.05 mm. Providing the conductive member 17A with such a thickness enables the solid electrolyte membrane 13 to be easily made to contact the conductor pattern layer D via the through-hole 17a when forming a film. In this example embodiment, a foil-like conductive member is used, but a linear or rectangular conductive member may also be used as long as it is able to electrically connect the conductor pattern layer D to the negative electrode of the power supply 16 without covering the film-forming region of the surface Da of the conductor pattern layer D.

When forming a film, the conductive member 17A is arranged on the surface Ba of the resin substrate B such that the surface Da of the conductor pattern layer D of the resin substrate B is exposed, and the pair of the flange portions 17b contact the metal base 40, as shown in FIG. 2. With this arrangement, a portion of the opening edge that forms the through-hole 17a of the conductive member 17A contacts the end portion C of the conductor pattern layer D. As a result, the conductor pattern layer D is electrically connected to the negative electrode of the power supply 16 via the metal base 40 and the conductive member 17A.

In this example embodiment, the conductive member 17A is electrically connected to the negative electrode of the power supply 16 via the metal base 40, but the conductive member 17A may also be directly connected to the negative electrode of the power supply 16 and the metal base 40 may be omitted, and a non-conductive base may be used instead of the metal base.

Figure 3B:
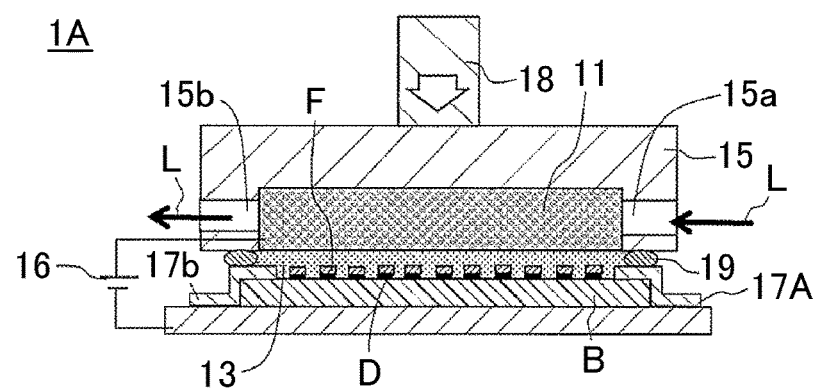
FIG. 3B is a sectional view showing a frame format of the film forming apparatus shown in FIG. 1 when a film is being formed.
Figure 3C:
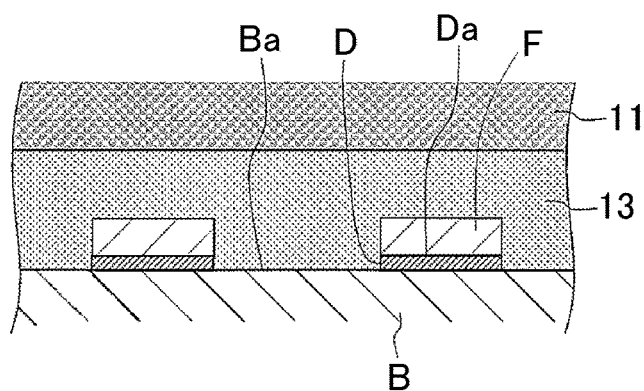
FIG. 3C is a partial expanded view of an area of the resin substrate in FIG. 3B that is near the conductor pattern layer.

A film forming method according to this example embodiment will now be described. FIG. 3A, FIG. 3B and FIG. 3C are views illustrating a film forming method by the metal-film forming apparatus 1A shown in FIG. 1. FIG. 3A is a sectional view showing a frame format of the film forming apparatus 1A before a film is formed, FIG. 3B is a sectional view showing a frame format of the film forming apparatus 1A when a film is being formed, and FIG. 3C is a partial expanded view of an area of the resin substrate B in FIG. 3B that is near the conductor pattern layer D.

First, as shown in FIG. 3A, the resin substrate B on which the conductor pattern layer D is formed is arranged on the metal base 40, and the conductive member 17A is arranged on the surface Ba of the resin substrate B in the manner shown in FIG. 2. As a result, the conductive member 17A contacts the end portion C of the conductor pattern layer D and the pair of flange portions 17b contact the metal base 40, such that the negative electrode of the power supply 16 that applies voltage is electrically connected to the conductor pattern layer D.

Next, as shown in FIG. 3B, the solid electrolyte membrane 13 that is arranged on the surface of the anode 11 that is made of porous material is brought into contact with the surface Da of the conductor pattern layer D of the resin substrate B via the through-hole 17a of the conductive member 17A, using the pressing portion 18. In this contact state, the solid electrolyte membrane 13 is further pressed against the conductor pattern layer D formed on the resin substrate B.

As a result of the solid electrolyte membrane 13 being pressed against the conductor pattern layer D in this way, the solid electrolyte membrane 13 is able to be made to uniformly follow the surface Da of the conductor pattern layer D. In this example embodiment, a film is formed while the solid electrolyte membrane 13 is pressed against the conductor pattern layer D, with the anode 11 that is pressed on by the pressing portion 18 as back-up material, so a metal film F of a more uniform thickness is able to be formed.

The metal solution supply portion 21 is driven while maintaining the pressure by the pressing portion 18. As a result, the metal solution L that has been regulated to a predetermined metal ion concentration is supplied to the supply passage 15a of the housing 15, and the metal solution L that has passed through the anode 11 and been discharged from the discharge passage 15b is supplied into the film forming apparatus 1A from the metal solution supply portion 21. That is, the metal solution L is circulated between the housing 15 and the metal solution supply portion 21. At this time, some of the metal solution L that has passed through the anode 11 contacts the solid electrolyte membrane 13, and is able to impart film-forming metal ions into the solid electrolyte membrane 13. By flowing the metal solution L into the anode 11, the metal solution L contacts the solid electrolyte membrane 13 and supplies metal ions to the solid electrolyte membrane 13 when necessary, impregnating the solid electrolyte membrane 13 with the metal ions.

Next, voltage is applied between the anode 11 and the conductor pattern layer D that serves as the cathode, using the power supply 16. As described above, the conductive member 17A is connected to the end portion C of the conductor pattern layer D, so the negative electrode of the power supply 16 is electrically connected to the conductor pattern layer D. Therefore, with the application of voltage by the power supply 16, the metal ions contained in the solid electrolyte membrane 13 are reduced at the surface Da of the conductor pattern layer D, thus enabling metal to be deposited on the surface Da of the conductor pattern layer D. As a result, the metal film F is able to be formed on the surface Da of the conductor pattern layer D, as shown in FIG. 3C. After the metal film F is formed, the conductive member 17A that is contacting the end portion C is removed from the end portion C of the conductor pattern layer D (i.e., the conductive member 17A is removed from the resin substrate B).

In this example embodiment, metal is able to be deposited on the surface Da of the conductor pattern layer D by reducing the metal ions contained in the solid electrolyte membrane 13, and the metal film F is able to be easily formed on this surface Da, without newly forming an unnecessary conductor pattern layer for electrically connecting the negative electrode of the power supply 16 as in the related art, by using the conductive member 17A. Also, because the conductive member 17A is made to contact the end portion C of the conductor pattern layer D, the metal film F is able to be suitably formed on the surface Da of the conductor pattern layer D.

Figure 4:
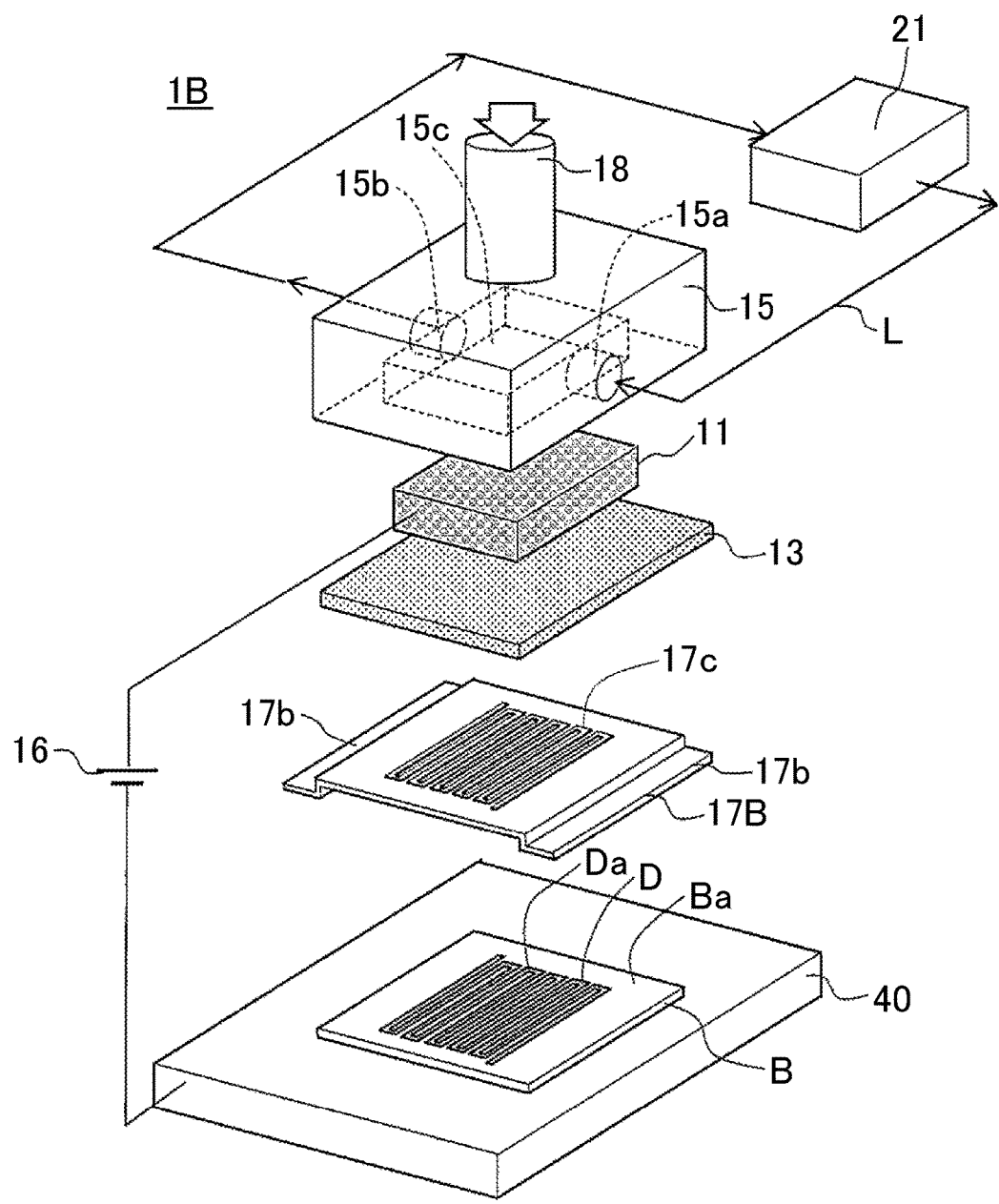
FIG. 4 is an exploded conceptual diagram schematically showing a metal-film forming apparatus according to a second example embodiment of the invention.
Figure 5:
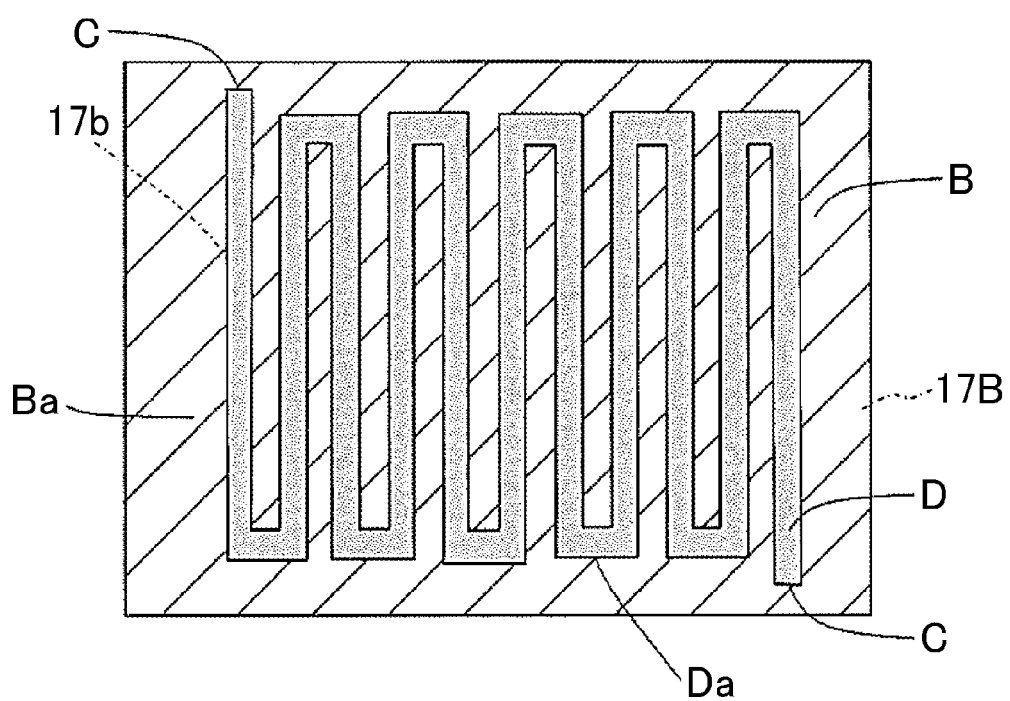
FIG. 5 is a plan view illustrating the positional relationship between a conductor pattern layer formed on a resin substrate, and a conductive member.

Next, a second example embodiment of the invention will be described. FIG. 4 is an exploded conceptual diagram schematically showing a metal-film forming apparatus 1B according to a second example embodiment of the invention, and FIG. 5 is a plan view illustrating the positional relationship between a conductor pattern layer D formed on a resin substrate B, and a conductive member 17B. The film forming apparatus 1B of the second example embodiment differs from the film forming apparatus 1A of the first example embodiment in terms of the structure of the conductive member 17B. Therefore, structure that is common to the first example embodiment will be denoted by like reference characters, and a detailed description of that structure will be omitted.

As shown in FIG. 4, the conductive member 17B of the film forming apparatus 1B according to the second example embodiment is a metal plate that covers the resin substrate B. A through-hole 17c corresponding to the pattern shape of the conductor pattern layer D is formed in the conductive member 17B. This through-hole 17c matches the conductor pattern layer D. When the conductive member 17B is arranged on the resin substrate B such that the through-hole 17c is positioned over the conductor pattern layer D, a surface on which the conductor pattern layer D is not formed (the region indicated by diagonal lines in FIG. 5), of the surface Ba of the resin substrate B, is covered by the conductive member 17B. That is, the surface of the resin substrate B where the conductor pattern layer D is not formed is masked by the conductive member 17B, and the conductor pattern layer D is exposed through the through-hole 17c.

Furthermore, just as in the first example embodiment, the through-hole 17c is formed such that a portion of an opening edge that forms the through-hole 17c of the conductive member 17B contacts an end portion C of the conductor pattern layer D. As a result, the conductive member 17B is able to be electrically connected to the conductor pattern layer D when forming a film.

Just as in the first example embodiment, a pair of flange portions 17b are formed one on each side of the conductive member 17B according to this example embodiment. The metal given as an example in the first example embodiment is used as the material of the conductive member 17B.

Figure 6A:
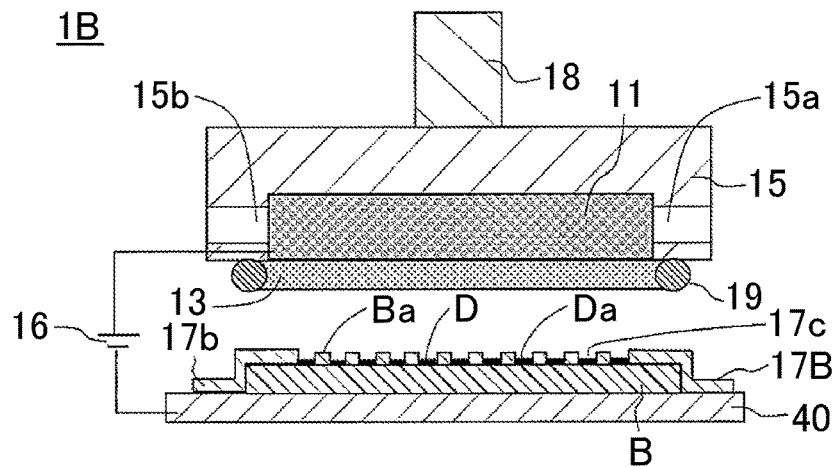
FIG. 6A is a sectional view showing a frame format of a film forming apparatus shown in FIG. 4 before a film is formed.
Figure 6B:
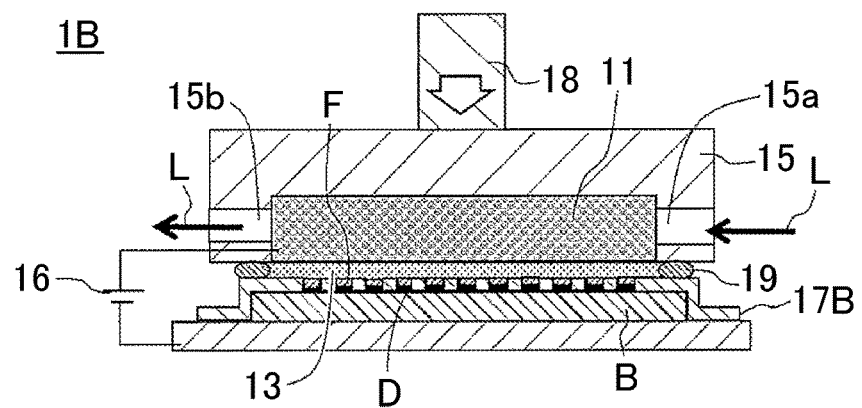
FIG. 6B is a sectional view showing a frame format of the film forming apparatus shown in FIG. 4 when a film is being formed.
Figure 6C:
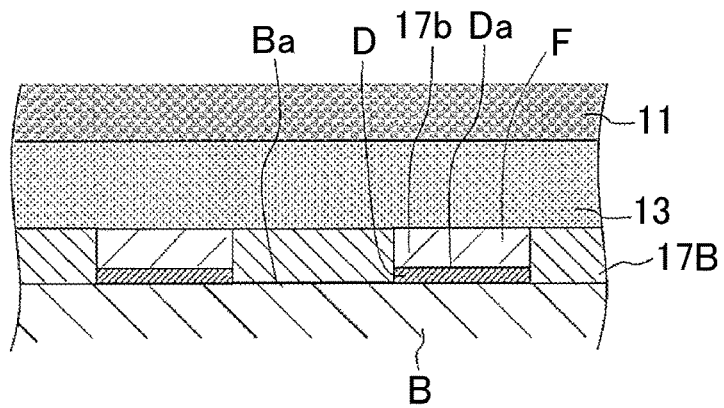
FIG. 6C is a partial expanded view of an area near the conductor pattern layer of the resin substrate in FIG. 6B.

Hereinafter, a film forming method according to this example embodiment will be described. FIGS. 6A to 6C are views illustrating the film forming method by the metal-film forming apparatus 1B shown in FIG. 4. FIG. 6A is a sectional view showing a frame format of the film forming apparatus 1B before a film is formed, FIG. 6B is a sectional view showing a frame format of the film forming apparatus 1B when a film is being formed, and FIG. 6C is a partial expanded view of an area near the conductor pattern layer D of the resin substrate B in FIG. 6B.

First, as shown in FIG. 6A, the resin substrate B on which the conductor pattern layer D is formed is arranged on the metal base 40, and then the conductive member 17B is arranged on the surface Ba of the resin substrate B in the manner shown in FIG. 5. As a result, the conductive member 17B contacts the end portion C of the conductor pattern layer D, and the pair of flange portions 17b contact the metal base 40, such that that the negative electrode of the power supply 16 is electrically connected to the conductor pattern layer D.

Furthermore, in this example embodiment, only the surface Da of the conductor pattern layer D on which the film is to be formed is exposed through the through-hole 17c of the conductive member 17B. The other surface of the resin substrate B is masked by the conductive member 17B.

Next, as shown in FIG. 6B, the solid electrolyte membrane 13 that is arranged on the surface of the anode 11 is brought into contact with, and pressed against, the surface Da of the conductor pattern layer D of the resin substrate B via the through-hole 17c of the conductive member 17B, using the pressing portion 18. In this example embodiment, only the surface Da of the conductor pattern layer D contacts the solid electrolyte membrane 13. The other surface of the resin substrate B does not contact the solid electrolyte membrane 13. The solid electrolyte membrane 13 is able to be made to uniformly follow the surface Da of the conductor pattern layer D.

While maintaining this pressed state, the metal solution supply portion 21 is driven to circulate the metal solution L inside the film forming apparatus 1B, such that the metal solution L contacts the solid electrolyte membrane 13 via the anode 11, and film-forming metal ions are supplied to the solid electrolyte membrane 13, just as in the first example embodiment. Next, voltage is applied between the anode 11 and the conductor pattern layer D that serves as the cathode, using the power supply 16.

As described above, the conductive member 17B is contacting the end portion C of the conductor pattern layer D, so the negative electrode of the power supply 16 is electrically connected to the conductor pattern layer D. Therefore, with the application of voltage by the power supply 16, the metal ions contained in the solid electrolyte membrane 13 are reduced at the surface Da of the conductor pattern layer D, thus enabling metal to be deposited on the surface Da of the conductor pattern layer D. As a result, with this example embodiment as well, a metal film F is able to be formed on the surface Da of the conductor pattern layer D, without newly forming an unnecessary conductor pattern layer. After the metal film F is formed, the conductive member 17B that is contacting the end portion C is removed from the end portion C of the conductor pattern layer D (i.e., the conductive member 17B is removed from the resin substrate B).

Moreover, in this example embodiment, as shown in FIG. 6C, the metal ions are reduced from the solid electrolyte membrane 13 through the through-hole 17c in the conductive member 17B while the surface Ba of the resin substrate B is masked by the conductive member 17B, so metal is able to be deposited on the surface Da of the conductor pattern layer D. As a result, metal is only deposited in the layer thickness direction of the conductor pattern layer D, so a metal film will not expand in a direction (an in-plane direction) along the masked surface of the resin substrate B. As a result, a metal film F with a distinctive edge portion is able to be formed.

Figure 8:
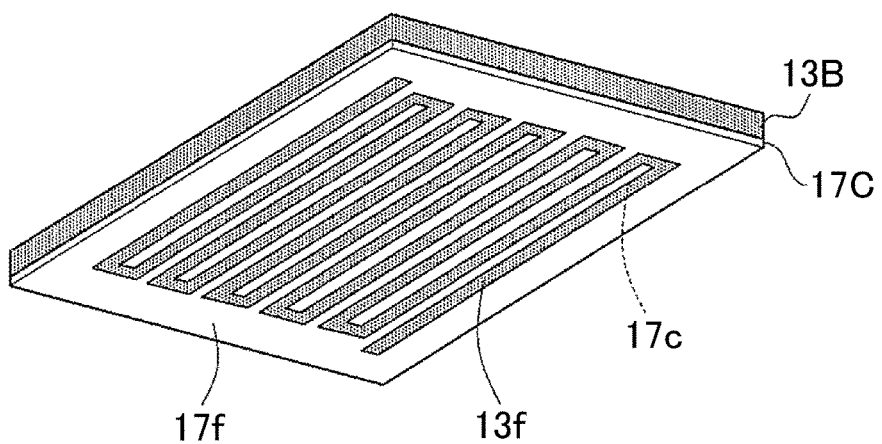
FIG. 8 is a perspective view schematically showing a solid electrolyte membrane to which a conductive member is attached, viewed from a back side.
Figure 9:
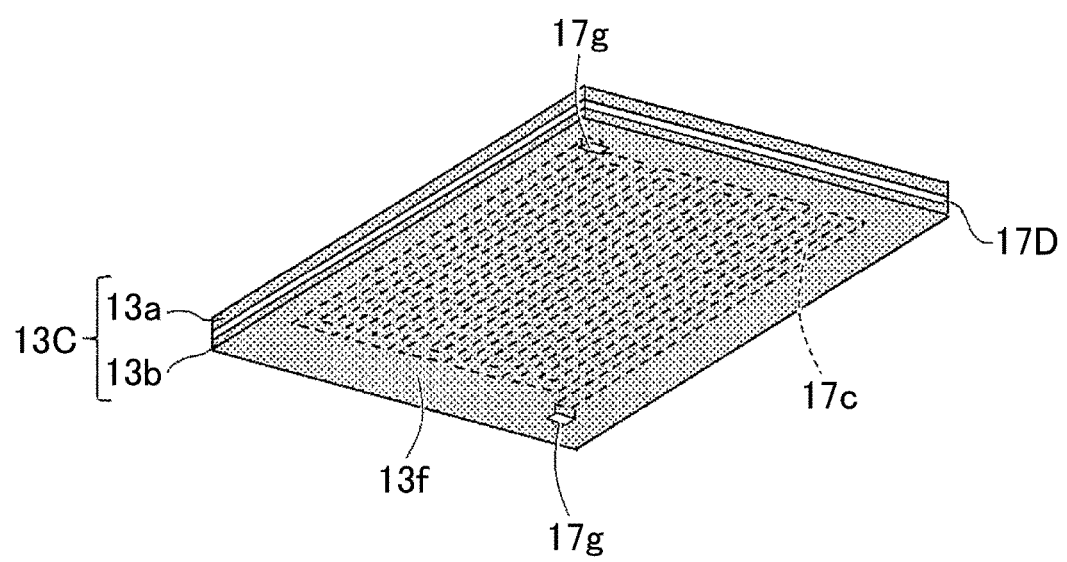
FIG. 9 is a perspective view showing a frame format of a modified example of the solid electrolyte membrane to which the conductive member is attached according to the third example embodiment of the invention.
Figure 10A:
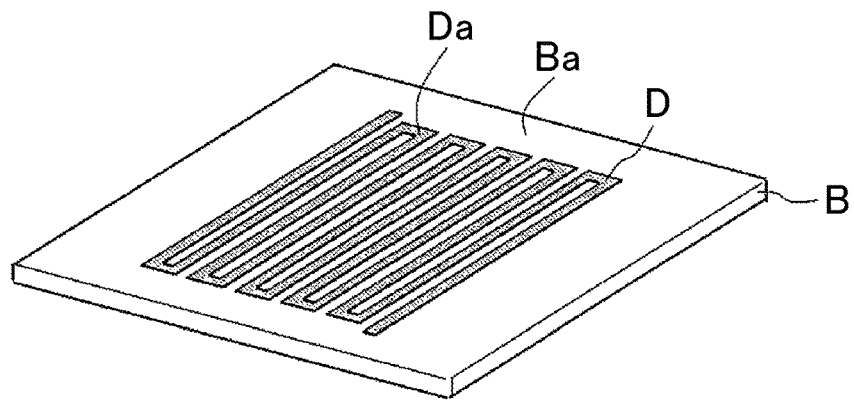
FIG. 10A is a perspective view showing a frame format of a related resin substrate on which a conductor pattern layer is formed.
Figure 10B:
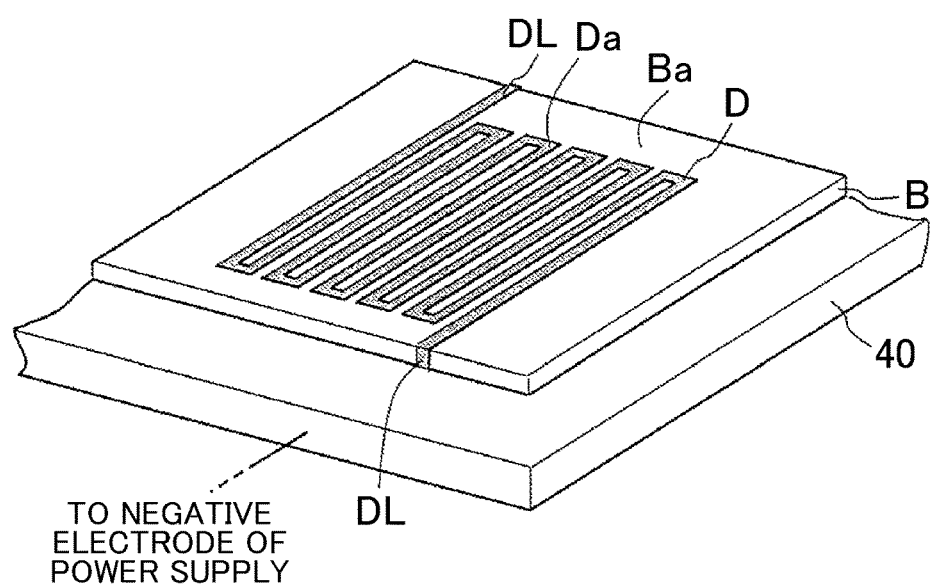
FIG. 10B is a view of a resin substrate provided with an extension portion for forming a film in order to form a conductor pattern layer.

Next, a third example embodiment of the invention will be described. FIG. 7 is an exploded conceptual diagram schematically showing a metal-film forming apparatus 1C according to the third example embodiment of the invention. FIG. 8 is a perspective view schematically showing a solid electrolyte membrane 13B to which a conductive member 17C is attached, viewed from a back side. FIG. 9 is a perspective view showing a frame format of a modified example of the solid electrolyte membrane to which the conductive member is attached according to the third example embodiment of the invention.

The film forming apparatus 1C of the third example embodiment differs from the film forming apparatus 1A of the first example embodiment in terms of the structures of the conductive member 17C and the solid electrolyte membrane 13B, and in that the negative electrode of the power supply 16 is connected to the conductive member 17C. Therefore, structure that is common to the first example embodiment will be denoted by like reference characters, and detailed descriptions of that structure will be omitted.

As shown in FIGS. 7 and 8, the conductive member 17C of the film forming apparatus 1C according to the third example embodiment is attached to the solid electrolyte membrane 13B. A through-hole 17c of the same size and shape as the through-hole 17c illustrated in the second example embodiment is formed in the conductive member 17C. This through-hole 17c is filled with solid electrolyte of the solid electrolyte membrane 13B.

In this example embodiment, a surface 17f that contacts the resin substrate B, of the surface of the conductive member 17C, and a surface 13f of the solid electrolyte membrane 13B that is exposed through the through-hole 17c, are on the same plane. As a result, the solid electrolyte membrane 13B is also able to be easily made to contact the conductor pattern layer D, while the conductive member 17C is easily made to contact a portion (an end portion) of the conductor pattern layer, just as in the second example embodiment.

When forming a film, the conductive member 17C is also pressed on, together with the solid electrolyte membrane 13B, by the pressing portion 18. At this time, the conductive member 17C and the conductor pattern layer D formed on the resin substrate B are arranged in the same manner as that shown in FIG. 5. Therefore, the conductive member 17C contacts a portion of the conductor pattern layer D, and the conductor pattern layer D is electrically connected to the negative electrode of the power supply 16. Further, the solid electrolyte membrane 13 contacts the surface Da of the conductor pattern layer D via the through-hole 17c.

While maintaining this contact state, the metal solution L is circulated inside the film forming apparatus 1C, and voltage is applied between the anode 11 and the conductor pattern layer D by the power supply 16, just as in the first and second example embodiments. As a result, when forming a film, the conductive member 17C, together with the solid electrolyte membrane 13B, is able to be made to contact the conductor pattern layer D, so a metal film is able to be formed even more easily on the surface Da of the conductor pattern layer D. Also, just as in the second example embodiment, the film is formed while masking the surface Ba of the resin substrate B with the conductive member 17C, so a metal film will not expand in a direction (an in-plane direction) along the masked surface of the resin substrate B. As a result, a metal film F with a distinctive edge portion is able to be formed.

In this example embodiment, the surface 17f of the resin substrate B and the surface 13f of the solid electrolyte membrane 13B are on the same plane, but the positional relationship of these surfaces may also be set beforehand according to the thickness of the conductor pattern layer D or the like. Also, after the metal film is formed, the conductive member 17C is raised together with the solid electrolyte membrane 13, such that the conductive member 17C and the solid electrolyte membrane 13 are removed from the portion (i.e., the end portion) of the conductor pattern layer D.

Further, as shown in FIG. 9, a conductive member 17D in which a through-hole 17c is formed may also be arranged inside a solid electrolyte membrane 13C. More specifically, a pair of solid electrolyte layers 13a and 13b are stacked one on each side of the conductive member 17D, such that some of the solid electrolyte of one of a pair of solid electrolyte layers 13a and 13b is filled into the through-hole 17c. Moreover, a conductive contact portion 17g for contacting the conductor pattern layer D is provided on the solid electrolyte layer 13b, and this conductive contact portion 17g is electrically connected to the conductive member 17D.

With this kind of structure, if the solid electrolyte membrane 13C is pressed against the resin substrate B by the pressing portion 18 when forming a film, the conductive contact portion 17g will contact a portion (the end portion) of the conductor pattern layer D, and the conductor pattern layer D will be electrically connected to the negative electrode of the power supply 16 via the conductive member 17D. By circulating the metal solution L in the film forming apparatus 1C and applying voltage between the anode 11 and the conductor pattern layer D with the power supply 16 in this state, a metal film is able to be formed on the surface Da of the conductor pattern layer D. In this modified example, the conductor pattern layer D is arranged inside the solid electrolyte membrane 13C, so when forming a film, only the conductive contact portion 17g contacts the conductor pattern layer D. The conductive member 17D is not in direct metal-to-metal contact with the conductor pattern layer D, so damage to the conductor pattern layer D can be avoided.

The invention will now be described using the examples below.

First, a first example, Example 1, will be described. In Example 1, a metal film was formed using the apparatus shown in FIG. 4 described above. A resin substrate (50 mm×50 mm×1 mm thick) made of epoxy resin was prepared, and a conductor pattern layer made of copper with a wiring width of 1 mm and intervals (gaps) of 1 mm was formed by printing. More specifically, a conductor pattern layer was formed by printing a slurry including copper particles in a predetermined pattern shape (see FIG. 2) on a surface of the resin substrate, and then drying and baking the slurry.

A conductive member made of aluminum 0.05 mm thick in which is formed a through-hole corresponding to the shape of the conductor pattern layer was prepared, and the conductive member was arranged on the resin substrate such that the conductor pattern layer was exposed through the through-hole. In this state, the conductive member was made to contact an end portion of the conductor pattern layer, and a negative electrode of a power supply was electrically connected to the conductor pattern layer.

Next, a solid electrolyte membrane was arranged between an anode and the resin substrate, while a copper sulfate aqueous solution of 1 mol/L was supplied from above the anode, and the solid electrolyte membrane was pressed onto the conductor pattern layer via the anode. A copper film formed while applying a pressure of 0.5 MPa for 10 minutes with a current density of 10 mA/cm². As a result, an even copper film formed on the surface of the conductor pattern layer.

An anode in which a surface of porous material (by Mitsubishi Materials) made of foamed titanium that is 10 mm×10 mm×1 mm was platinum-plated was used for the anode. An electrolyte membrane (Nafion N117 by DuPont) having a film thickness of 183 μm was used for the solid electrolyte membrane.

Next, a second example, Example 2, will be described. In Example 2, a copper film was formed on a surface of a conductor pattern layer, similar to Example 1. Example 2 differs from Example 1 in that the conductive member is made of titanium. In this case as well, a copper film formed on the surface of the conductor pattern layer.

Next, a third example, Example 3, will be described. In Example 3, a copper film formed on a surface of a conductor pattern layer, similar to Example 1. Example 3 differs from Example 1 in that the conductive member is made of iron. In this case as well, a copper film formed on the surface of the conductor pattern layer, similar to Example 1. However, in Example 3, a copper film also formed on a surface of the conductive member.

From the results of Examples 1 to 3 above, it is thought that the copper film formed on the surface of the conductive member in Example 3 because a metal that is more easily plated than aluminum or titanium was used for the material of the conductive member. Therefore, it is thought that a copper film will not form as easily on the surface of the conductive member if the conductive member is made of aluminum, titanium, or molybdenum or tungsten as metals that are more chemically stable than aluminum and titanium. Furthermore, in Examples 1 to 3, the metal that forms the metal film is copper, but even when that metal is nickel, silver, or gold, it is thought that a metal film will not easily form on the surface of the conductive member if the conductive member is made out of one of the metals described above.

What is claimed is:

1. A metal-film forming apparatus comprising:
   an anode;
   a resin substrate having a surface on which a conductor pattern layer that serves as a cathode is formed;
   a solid electrolyte membrane that contains metal ions and is arranged between the anode and the resin substrate, the solid electrolyte membrane being arranged contacting a surface of the conductor pattern layer when a metal film is formed on the conductor pattern layer;
   a power supply that applies a voltage between the anode and the conductor pattern layer; and
   a conductive member that is arranged contacting at least an end portion of the conductor pattern layer when the metal film is formed on the conductor pattern layer, such that a negative electrode of the power supply is electrically connected to the conductor pattern layer, the conductive member being detachable from the conductor pattern layer, wherein
   the metal ions are reduced to deposit metal that forms the metal film on the surface of the conductor pattern layer when the voltage is applied between the anode and the conductor pattern layer, wherein
   the conductive member is a metal plate that covers the resin substrate,
   the conductive member has a through-hole corresponding to a pattern shape of the conductor pattern layer, and
   the conductive member is arranged such that an opening edge that forms the through-hole of the conductive member contacts the end portion of to the conductor pattern layer when the metal film is formed without covering a film-forming region of the surface of the conductor pattern layer; and
   wherein the resin substrate is disposed on a metal base, the conductive member includes flange portions formed on outer edges of the conductive member, the flange portions contacting the metal base such that the negative electrode of the power supply is electrically connected to the conductor pattern layer via the metal base and the conductive member.

2. The metal-film forming apparatus according to claim 1, wherein
   the conductive member is attached to the solid electrolyte membrane.

3. The metal-film forming apparatus according to claim 1, wherein
   the metal film is made of copper, nickel, silver, or gold, and
   the conductive member is made of aluminum, titanium, molybdenum, tungsten, or an alloy of at least two of aluminum, titanium, molybdenum, and tungsten.

4. A metal-film forming method, comprising:
   executing a forming of a metal film on a surface of a conductor pattern layer provided on a surface of a resin substrate by depositing metal on the surface of the conductor pattern layer, by applying a voltage between an anode and the conductor pattern layer that serves as a cathode and reducing metal ions in a solid electrolyte membrane, in a state where the solid electrolyte membrane is arranged between the anode and the resin substrate to contact the surface of the conductor pattern layer, wherein
   the forming of the metal film includes applying the voltage between the anode and the conductor pattern layer in a state where a conductive member that is detachable from the conductor pattern layer contacts at least an end portion of the conductor pattern layer, such that a negative electrode of a power supply that applies the voltage is electrically connected to the conductor pattern layer, wherein
   the conductive member is a metal plate that covers the resin substrate,
   the conductive member has a through-hole corresponding to a pattern shape of the conductor pattern layer, and the metal film is formed while the conductive member is arranged such that an opening edge that forms the through-hole of the conductive member contacts the end portion of the conductor pattern layer when the metal film is formed without covering a film-forming region of the surface of the conductor pattern layer, so that the conductive member is electrically connected to the conductor pattern layer, and wherein the resin substrate is disposed on a metal base, the conductive member includes flange portions formed on outer edges of the conductive member, the flange portions contacting the metal base such that the negative electrode of the power supply is electrically connected to the conductor pattern layer via the metal base and the conductive member.

5. The metal-film forming method according to claim 4, wherein the forming of the metal film is performed in a state where the conductive member is attached to the solid electrolyte membrane.

6. The metal-film forming method according to claim 4, wherein the metal film is made of copper, nickel, silver, or gold, and the conductive member is made of aluminum, titanium, molybdenum, tungsten, or an alloy of at least two of aluminum, titanium, molybdenum, and tungsten.

* * * * *